United States Patent [19]

Hwang

[11] Patent Number: 5,731,109

[45] Date of Patent: Mar. 24, 1998

[54] PATTERN STRUCTURE OF PHOTOMASK COMPRISING A SAWTOOTH PATTERN

[75] Inventor: Joon Hwang, Chungcheongbuk-do, Rep. of Korea

[73] Assignee: Hyundai Electronics Industries Co., Ltd., Kyungki-Do, Rep. of Korea

[21] Appl. No.: 661,372

[22] Filed: Jun. 11, 1996

[30] Foreign Application Priority Data

Jun. 15, 1995 [KR] Rep. of Korea .............. 95-15855

[51] Int. Cl.$^6$ ........................................ G03F 9/00
[52] U.S. Cl. ........................................ 430/5
[58] Field of Search ....................... 430/5, 311, 394, 430/396

[56] References Cited

U.S. PATENT DOCUMENTS 5,422,512  6/1995  Yamanaka ........................ 257/506
5,604,059  2/1997  Imura et al. ....................... 430/5

Primary Examiner—S. Rosasco
Attorney, Agent, or Firm—Fish & Richardson P.C.

[57] ABSTRACT

The present invention can improve the limits of the resolution in a stepper by forming some portions or whole portions of the edges of the photomask pattern into a constant saw toothed structure so that the interference phenomenon of the wavelength at its maximum is offsetted.

6 Claims, 4 Drawing Sheets

PATTERN STRUCTURE OF PHOTOMASK COMPRISING A SAWTOOTH PATTERN

FIELD OF THE INVENTION

The present invention relates to the pattern structure of a photomask which can improve resolution in a photolithography process using the photomask.

BACKGROUND OF THE INVENTION

Recently, with the higher integration and greater miniaturization of the semiconductor device, finer techniques in the photolithography process have become increasingly important. Steppers, such as the G-line stepper and the I-line stepper, which uses a source of light, are widely used in the photolithography. The (G-line stepper, using a wavelength of 436 nm, is suitable for manufacturing a class of 4M DRAM semiconductor devices and the I-line stepper, using a wavelength of 365 nm, is suitable for manufacturing a class of 64M DRAM. When a photoresist pattern having a micro line width beyond the limits of the resolution capabilities of such steppers is formed, it is difficult to attain the preferred pattern profile.

FIG. 1A and FIG. 2A are plane views of conventional photomasks in which a normal line pattern and a hole pattern can be formed, respectively. FIG. 1B and FIG. 2B show sectional views of photoresist patterns which are formed on the surface of the wafer using each of the photomasks shown in FIG. 1A and FIG. 2A.

The photomask 1 shown in FIG. 1A is made by forming a line pattern 3 on a quartz substrate 2 so as to form word lines, bit lines, metal lines, or other line patterns on a silicon substrate, with the line pattern being formed opaque materials such as chromium(Cr). The photomask 11 shown in FIG. 2A is made by forming a hole pattern 13 on a quartz substrate 12 so as to form a contact hole or via hole on a silicon substrate, with the hole pattern being formed opaque materials such as chromium. The edges of the line pattern 3 and the hole pattern 13 are generally formed with straight lines.

When the width of the line pattern 3 is designed in ultra-micro line width beyond the resolution limits of the stepper, the profile of the photoresist pattern 5, which is formed on the wafer 4, as shown in FIG. 1B, becomes degraded due to the interference of the wavelength. If such photoresist pattern 5 is used as an etching mask, lower reliability of the device will result because the desired pattern will not have been precisely formed on the device, thereby, degrading the profile of word lines, bit lines or metal lines. Similarly, when the width of the hole pattern 13 is designed in ultra micro space beyond the resolution limits of the stepper, the profile of the photoresist pattern 15 which is formed on the wafer 14, as shown in FIG. 2B, becomes degraded.

SUMMARY OF THE INVENTION

Accordingly, the purpose of the present invention is to provide a pattern structure for the photomask which can improve the limits of resolution that a stepper can have by offsetting the interference phenomenon of the wavelengths.

The photomask pattern structure of the present invention for accomplishing the above purpose comprises a quartz substrate and a light shielding pattern, wherein, the pattern edges of the light-shielding pattern are shaped to be saw toothed.

BRIEF DESCRIPTION OF THE DRAWINGS

For fuller understanding of the nature and objects of the invention, reference should be had to the following detailed description taken in conjunction with the accompanying drawings in which.

Similar reference characters refer to similar parts through the several views of the drawings.

DESCRIPTION OF THE INVENTION

Below, the present invention will be described in detail with reference to the accompanying drawings.

Figure 3A:
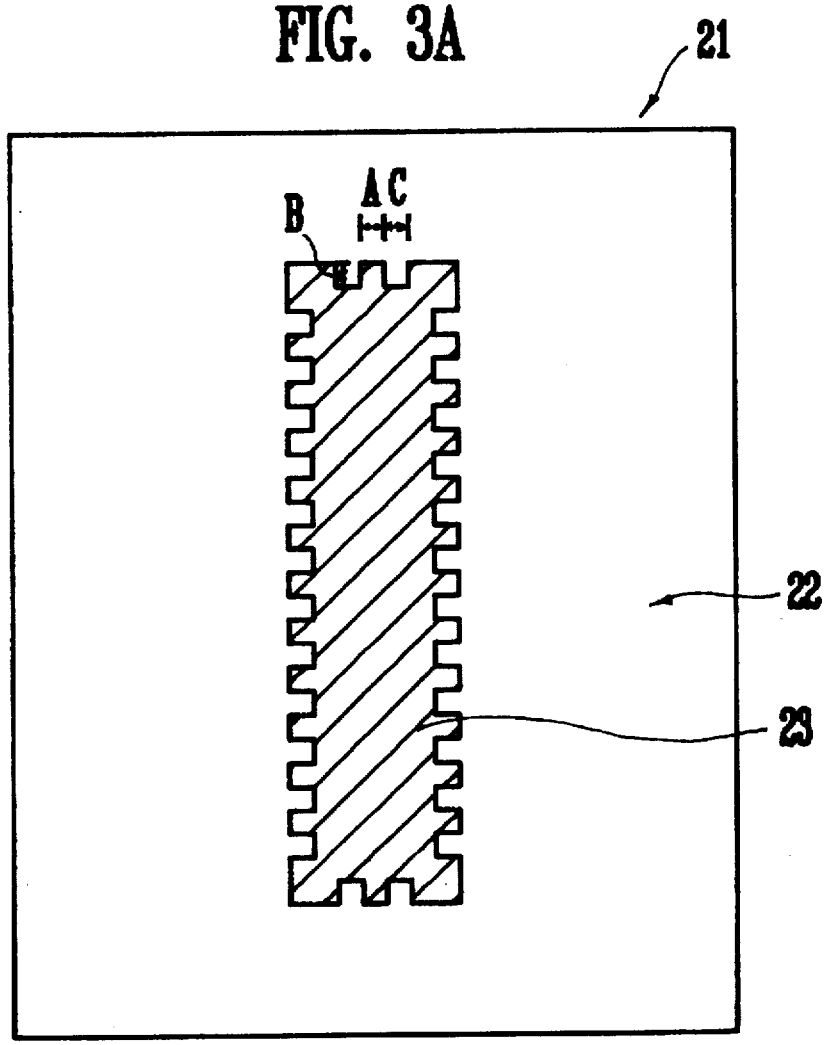
FIG. 3A and FIG. 4A show flat views of two photomasks, one in which a line pattern, and the other, in which a hole pattern, have been formed, respectively, according to the present invention.
Figure 3B:
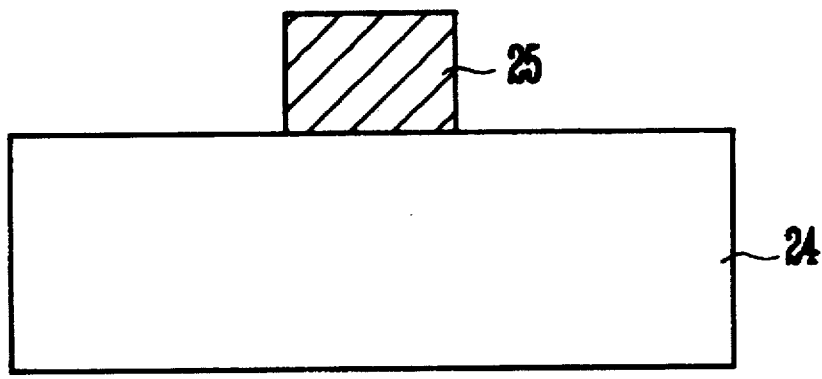
FIG. 3B and FIG. 4B show sectional views of photoresist patterns which are formed using each photomask shown in FIG. 3A and FIG. 4A.
Figure 4A:
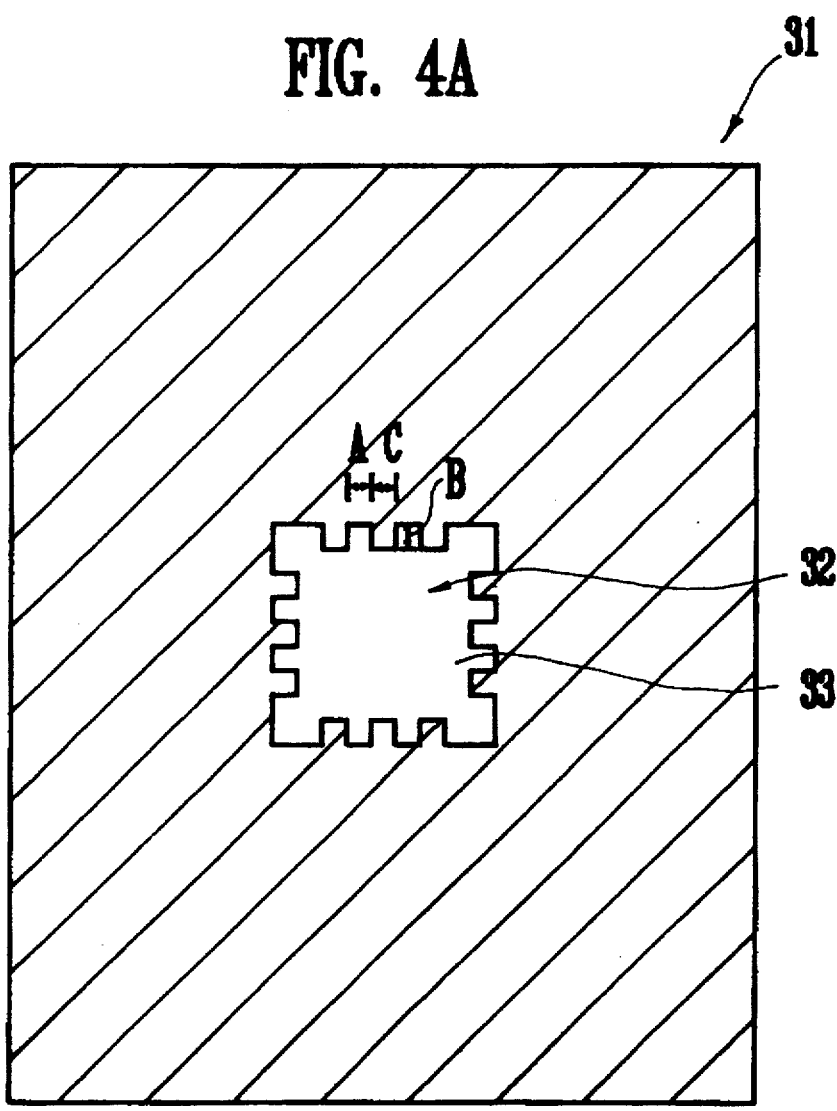
Figure 4B:
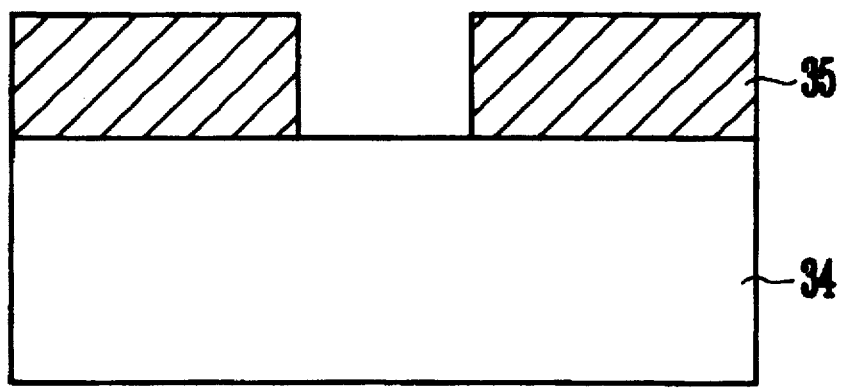

FIG. 3A and FIG. 4A show plane views of photomasks in which a line pattern and a hole pattern have been formed, respectively, according to the present invention, and FIG. 3B and FIG. 4B show sectional views of photoresist patterns which are formed using each photomask shown in FIG. 3A and FIG. 4A.

The photomask 21 shown in FIG. 3A is made by forming, according to a design rule, a line pattern 23 as a light-shielding pattern of chromium (Cr) onto a quartz substrate 22, so as to form word lines, bit lines, metal lines or other line patterns on the semiconductor device. And, the photomask 31 shown in FIG. 4A is made by removing, according to a design rule, a hole pattern 33 form some of the light-shielding pattern of chromium (Cr) covered onto a transparent quartz substrate 32, so as to form a contact hole or a via hole.

The important factor is that the edge portions of the line pattern 23 and the hole pattern 33 are formed in a saw-toothed structure, not in a straight lined structure. As the edge portions of the line pattern 23 and the hole pattern 33 are formed into the saw toothed structure, the limits of resolution in a stepper can be improved. In the above, the shape of the unit saw-tooth is square or triangular, and each size of the width "A" in the unit saw-tooth, the height "B" in the unit sexy-tooth, and the distance "C" between each neighboring unit saw-tooth, is ±0.1 μm, ±0.25 μm or 0.5 μm of the wavelength of the used light.

Figure 1A:
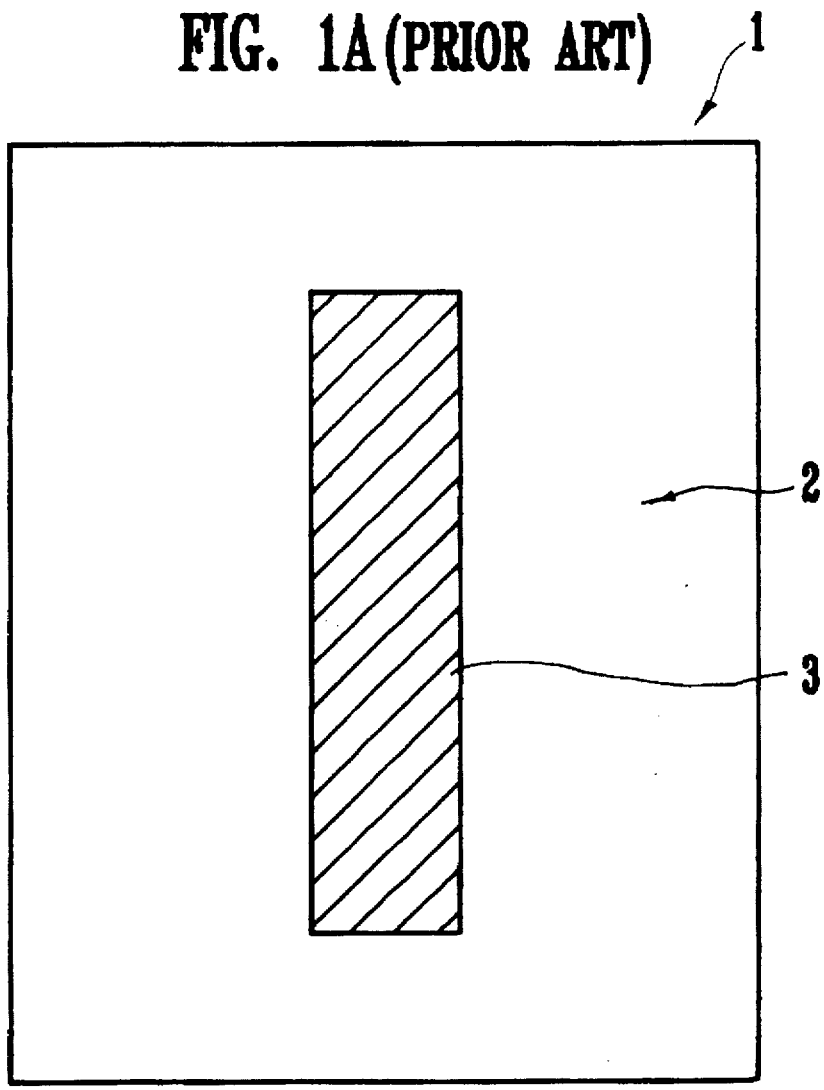
FIG. 1A and FIG. 2A show plane views of two photomasks, one in which a conventional line pattern, and the other, in which, a conventional hole pattern, have been formed, respectively.
Figure 1B:
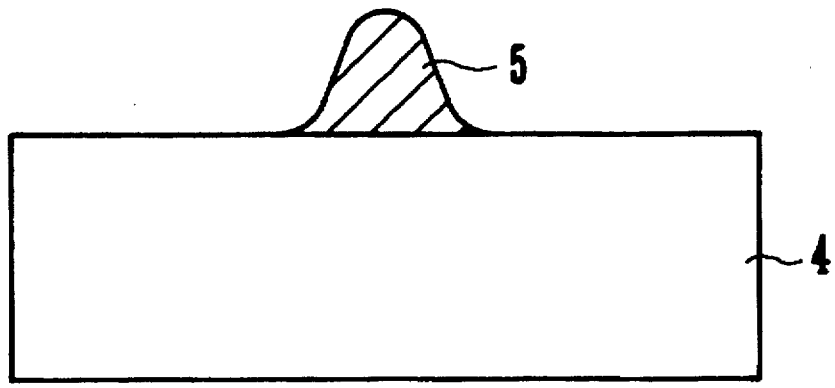
FIG. 1B and FIG. 2B show sectional views of photoresist patterns that are formed using each photomask shown in FIG. 1A and FIG. 2A.
Figure 2A:
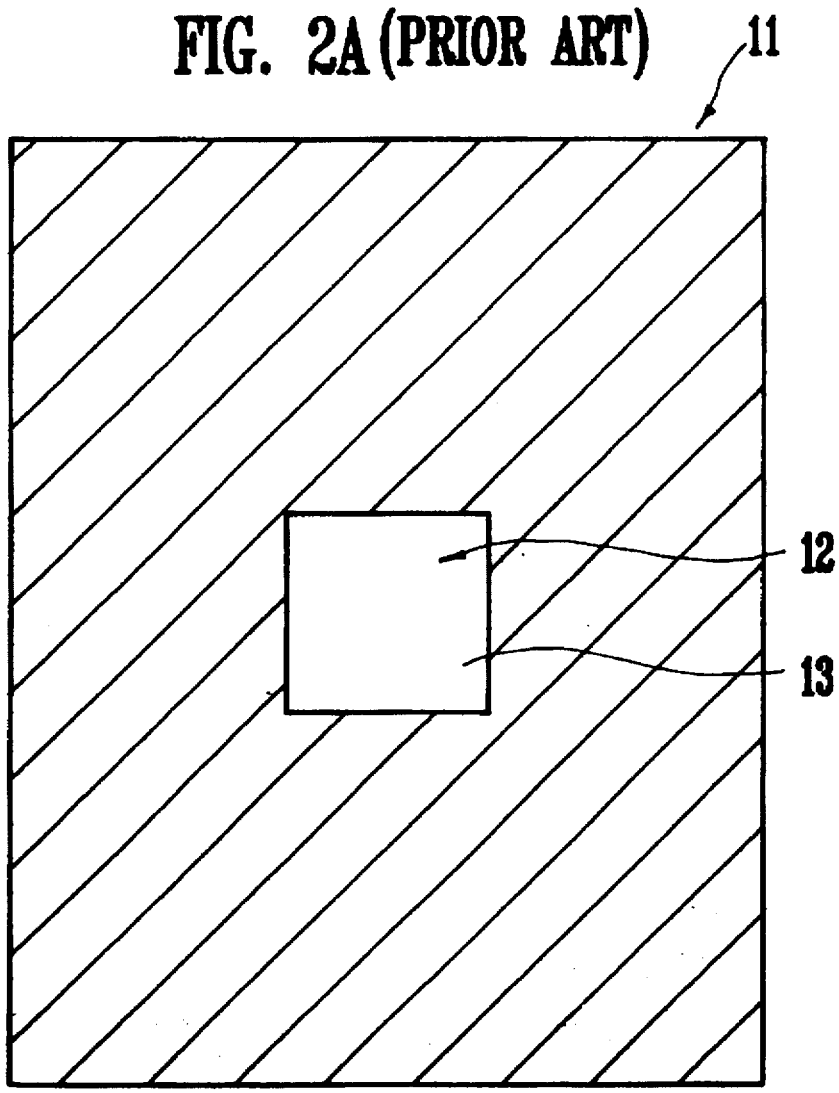
Figure 2B:
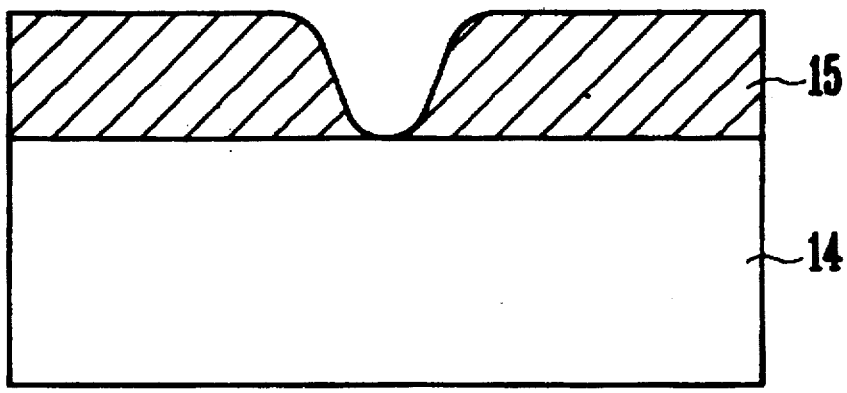

When a photolithography process is performed using the photomask 21 shown in FIG. 3A manufactured by the design rule applied with the photomask 1 shown in FIG. 1A, the profile of the photoresist pattern 25 formed on the wafer 24 becomes preferred rather than that of FIG. 1B as shown in FIG. 3B. Similarly, when the photomask 31 shown in FIG. 4A is manufactured by the same design rule with the photomask 11 shown in FIG. 2A and then processed through a photolithography process under the same conditions, the profile of the photoresist pattern 35 formed on the wafer 34 becomes preferred rather than that of FIG. 2B as shown in FIG. 4B.

As mentioned above, the present invention forms some portions or whole portions of the edges of the photomask pattern into a saw-toothed structure, which can improve the limits of resolution in a stepper by offsetting the interference phenomenon of the wavelength. Accordingly, the present invention can accomplish a preferred profile of the photoresist pattern in the manufacturing process of the semiconductor device, thereby improving the reliability of the device.

The foregoing description, although described in its preferred embodiment with a certain degree of particularity, is only illustrative of the principle of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A photomask comprising a quartz substrate and a light-shielding pattern formed on a selected portion on the quartz substrate, the photomask shaded in a saw-toothed structure which is shaped to offset interference between light passing through the quartz substrate and the light-shielding pattern.

2. The photomask of claim 1, wherein the shape of each saw tooth is square.

3. The photomask of claim 1, wherein the shape of each saw tooth is triangular.

4. The photomask of claim 2, wherein each of the width in said saw tooth, the height in said saw-tooth and the distance between said saw tooth neighboring is ±0.2 μm of the wavelength of the used light.

5. The photomask of claim 2, wherein each of the width in said saw-tooth, the height in said saw tooth and the distance between said saw-tooth neighboring is ±0.25 μm of the wavelength of the used light.

6. The photomask of claim 2, wherein each of the width in said saw tooth, the height in said saw-tooth and the distance between said saw tooth neighboring is ±0.5 μm of the wavelength of the used light.

* * * * *